United States Patent
Baiocco et al.

(10) Patent No.: US 9,034,748 B2
(45) Date of Patent: May 19, 2015

(54) PROCESS VARIABILITY TOLERANT HARD MASK FOR REPLACEMENT METAL GATE FINFET DEVICES

(71) Applicant: International Business Machines Corporation, Armonk, NY (US)

(72) Inventors: Christopher V. Baiocco, Newburgh, NY (US); Kevin K. Chan, Staten Island, NY (US); Young-Hee Kim, Mohegan Lake, NY (US); Masaharu Kobayashi, Yorktown Heights, NY (US); Effendi Leobandung, Stormville, NY (US); Fei Liu, Yorktown Heights, NY (US); Dae-Gyu Park, Poughquaq, NY (US); Helen Wang, LaGrangeville, NY (US); Xinhui Wang, Poughkeepsie, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 14/017,918

(22) Filed: Sep. 4, 2013

(65) Prior Publication Data

US 2015/0064897 A1    Mar. 5, 2015

(51) Int. Cl.
*H01L 21/302* (2006.01)
*H01L 21/461* (2006.01)
(Continued)

(52) U.S. Cl.
CPC ...... *H01L 21/28132* (2013.01); *H01L 29/6681* (2013.01); *H01L 21/0332* (2013.01); *H01L 21/32139* (2013.01); *Y10S 438/95* (2013.01)

(58) Field of Classification Search
CPC .................... H01L 21/32139; H01L 21/0337; H01L 21/31144; H01L 21/00; H01L 21/32; H01L 21/76202; H01L 21/76216; H01L 21/0332; H01L 21/3081; H01L 21/3086; G03F 7/094
USPC ....... 438/717, 736, 950, 448, 551, FOR. 307; 257/E21.035, E21.232
See application file for complete search history.

(56) References Cited

U.S. PATENT DOCUMENTS

| | | | |
|---|---|---|---|
| 2003/0219973 A1 | 11/2003 | Townsend, III et al. | |
| 2006/0223250 A1 | 10/2006 | Romero et al. | |

(Continued)

FOREIGN PATENT DOCUMENTS

| | | |
|---|---|---|
| CN | 100490090 C | 5/2009 |
| JP | 2012235124 A | 11/2012 |

(Continued)

*Primary Examiner* — Thao X Le
*Assistant Examiner* — Nduka Ojeh
(74) *Attorney, Agent, or Firm* — David Zwick; Louis J. Percello

(57) ABSTRACT

Embodiments include a method comprising depositing a hard mask layer over a first layer, the hard mask layer including; lower hard mask layer, hard mask stop layer, and upper hard mask. The hard mask layer and the first layer are patterned and a spacer deposited on the patterned sidewall. The upper hard mask layer and top portion of the spacer are removed by selective etching with respect to the hard mask stop layer, the remaining spacer material extending to a first predetermined position on the sidewall. The hard mask stop layer is removed by selective etching with respect to the lower hard mask layer and spacer. The first hard mask layer and top portion of the spacer are removed by selectively etching the lower hard mask layer and the spacer with respect to the first layer, the remaining spacer material extending to a second predetermined position on the sidewall.

10 Claims, 7 Drawing Sheets

(51) Int. Cl.
   *H01L 21/28*      (2006.01)
   *H01L 29/66*      (2006.01)
   *H01L 21/033*     (2006.01)
   *H01L 21/3213*    (2006.01)

(56) References Cited

U.S. PATENT DOCUMENTS

2009/0258482 A1* 10/2009 Lin et al. ................. 438/585
2010/0330763 A1* 12/2010 Freeman et al. ............... 438/302
2011/0171804 A1    7/2011 Wang et al.
2012/0276747 A1* 11/2012 Oh et al. ....................... 438/717
2012/0288802 A1* 11/2012 Wu et al. ....................... 430/314

FOREIGN PATENT DOCUMENTS

KR       100413908 B1    1/2004
KR       101061276 B1    8/2011

* cited by examiner

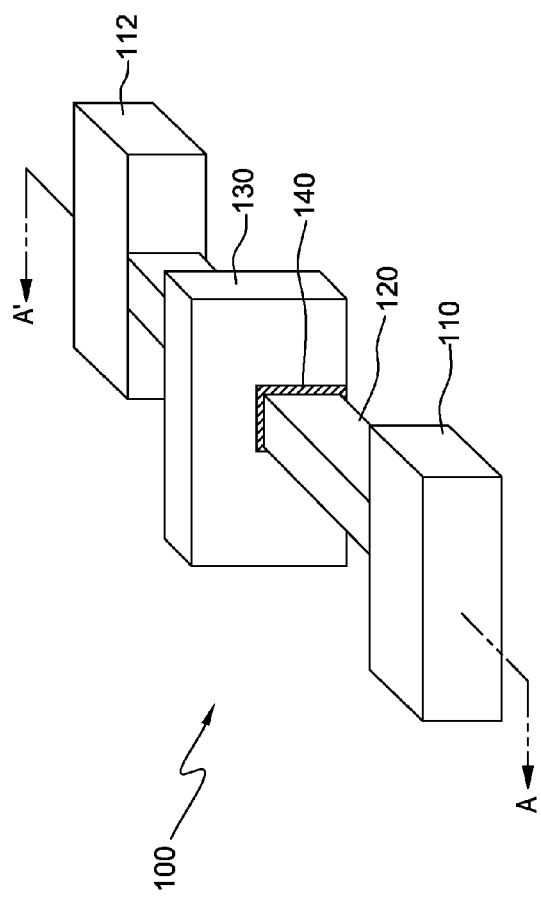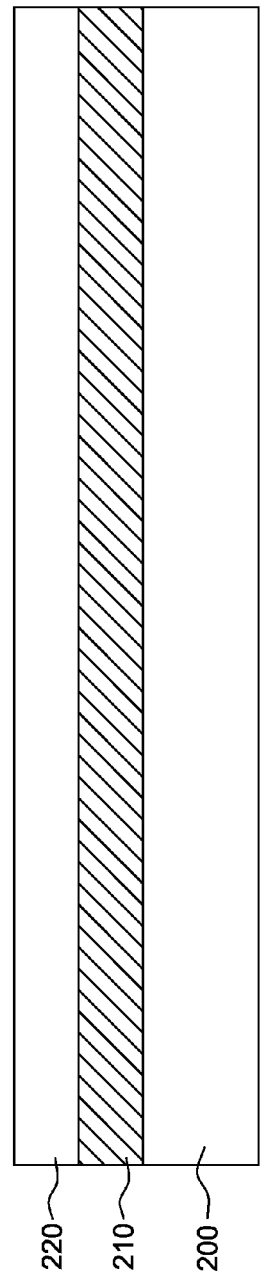

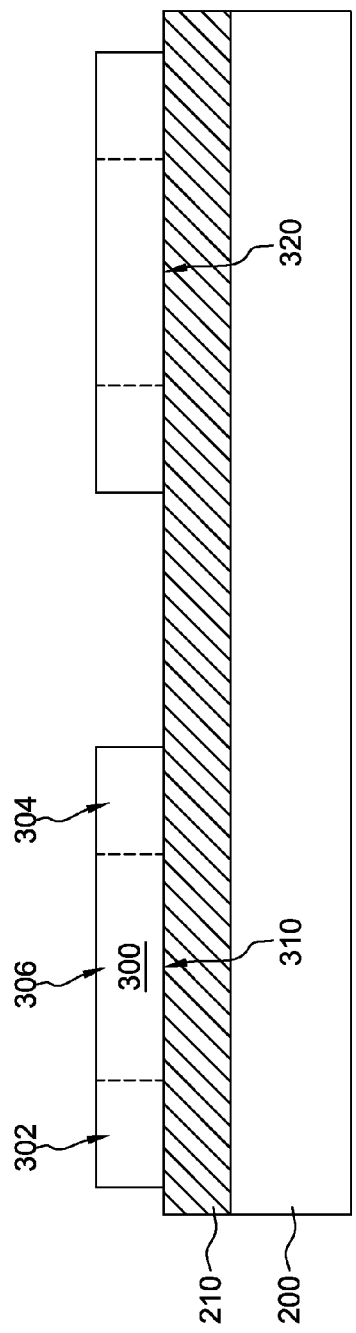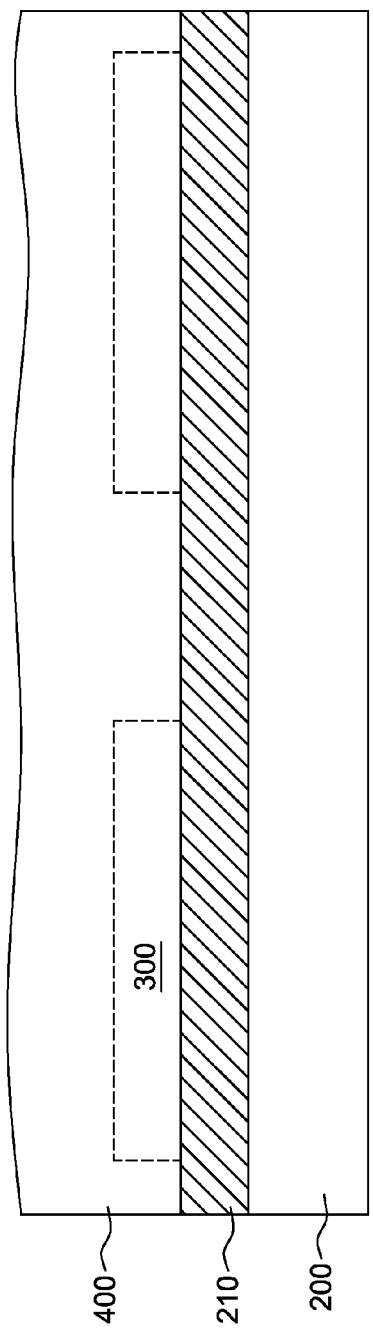

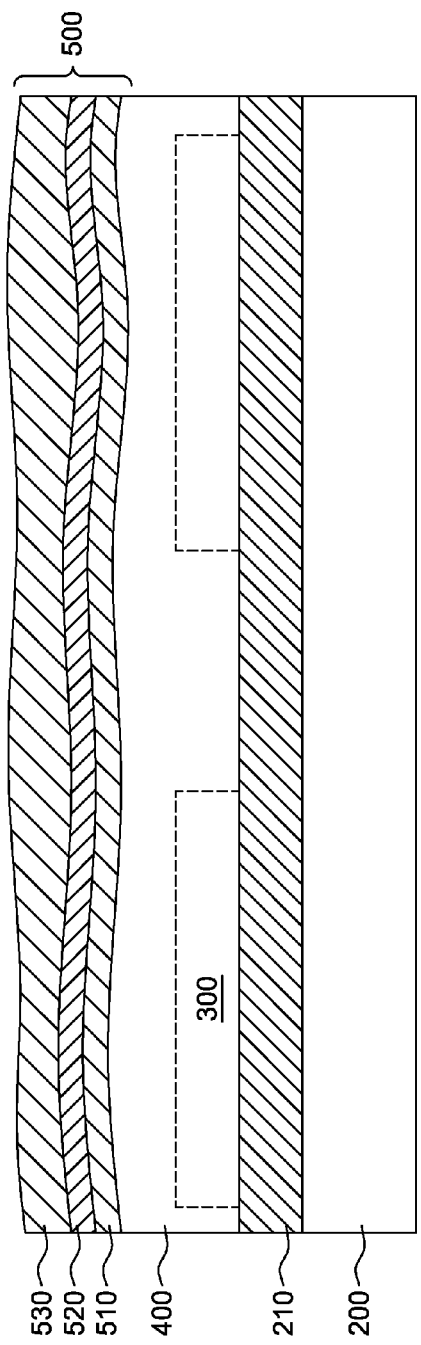
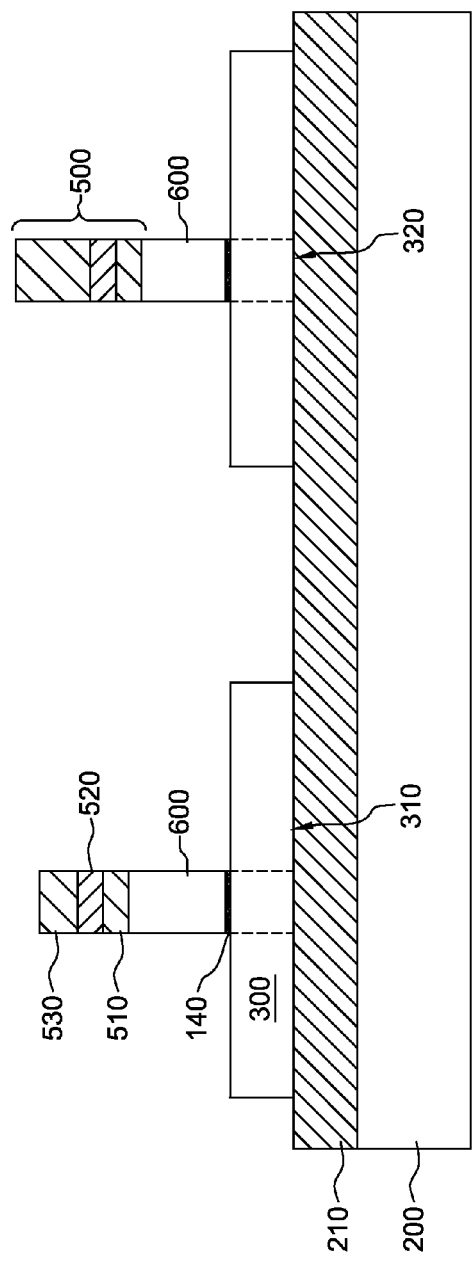

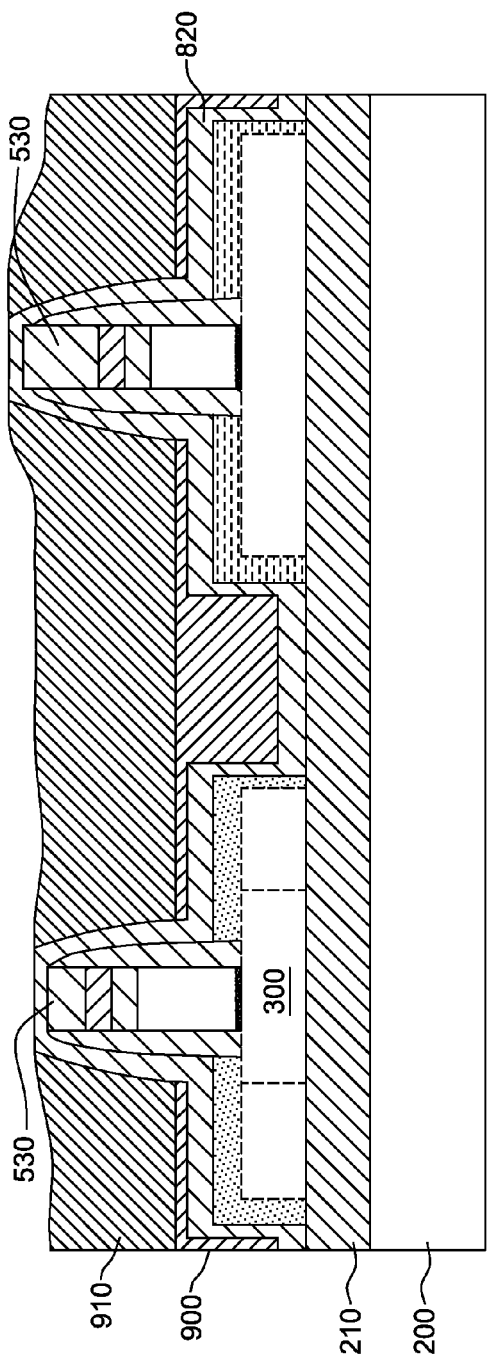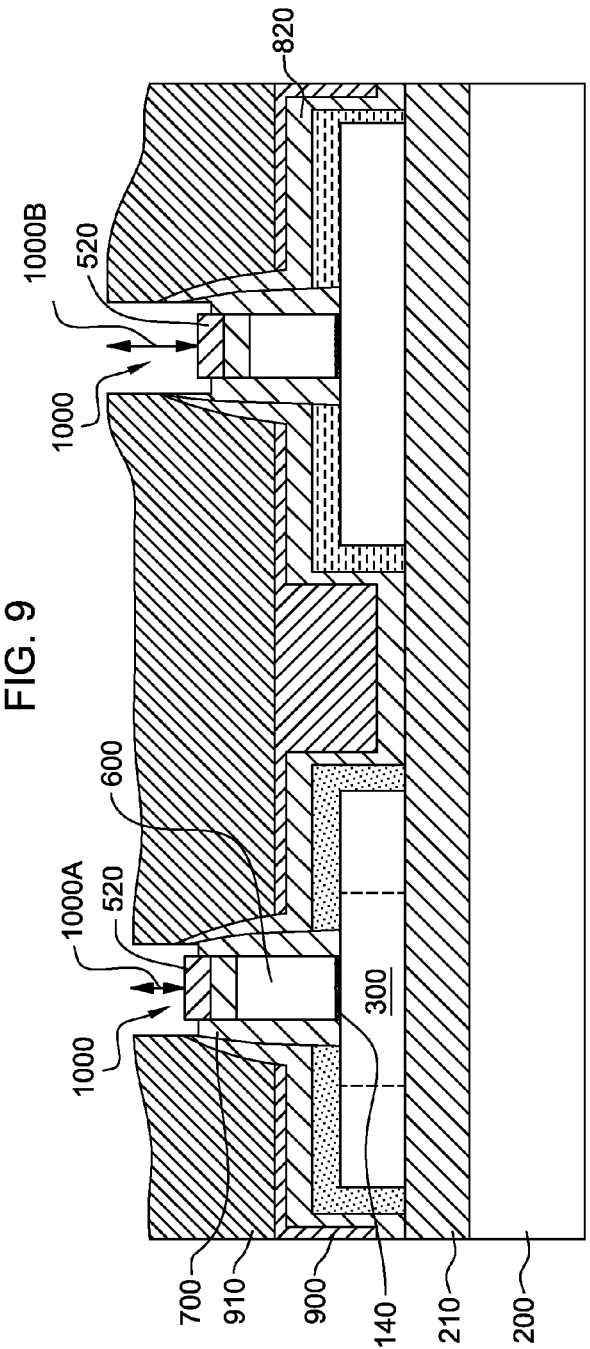

PROCESS VARIABILITY TOLERANT HARD MASK FOR REPLACEMENT METAL GATE FINFET DEVICES

FIELD OF THE INVENTION

The present invention relates generally to the fabrication of semiconductor devices, and more particularly to the fabrication of a finFET device.

BACKGROUND OF THE INVENTION

Field effect transistors (FETs) can be semiconductor devices fabricated on a bulk semiconductor substrate or on a silicon-on-insulator (SOI) substrate. FET devices generally consist of a source, a drain, a gate, and a channel between the source and drain. The gate is separated from the channel by a thin insulating layer, typically of silicon oxide, called the field or gate oxide. A voltage drop generated by the gate across the oxide layer induces a conducting channel between the source and drain thereby controlling the current flow between the source and the drain. Current integrated circuit designs use complementary metal-oxide-semiconductor (CMOS) technology that use complementary and symmetrical pairs of p-type and n-type metal oxide semiconductor field effect transistors (MOSFETs) for logic functions.

The integrated circuit industry is continually reducing the size of the devices, increasing the number of circuits that can be produced on a given substrate or chip. It is also desirable to increase the performance of these circuits, increase the speed, and reduce the power consumption. A three dimensional chip fabrication approach, such as a finFET, has been developed for semiconductor devices. A finFET is a non-planar FET. The "fin" is a narrow, vertical silicon base channel between the source and the drain. The fin is covered by the thin gate oxide and surrounded on two or three sides by an overlying gate structure. The multiple surfaces of the gate, allow for more effective suppression of "off-state" leakage current. The multiple surfaces of the gate also allow enhanced current in the "on" state, also known as drive current. These advantages translate to lower power consumption and enhanced device performance.

Polysilicon has been a preferred material for use as a gate electrode due to its thermal resistive properties and ability to withstand subsequent high temperature processes. Due to the higher resistivity of the polysilicon verses metal materials, a polysilicon gate may operate at much slower speeds than gates made of a metallic material. A further performance enhancement uses a replacement metal gate (RMG). This process removes the original polysilicon gate and replaces it with a metal gate material. A high-k dielectric can also be used as the gate oxide as a part of the RMG process.

Process challenges exist as the dimensions of the devices decrease. Uniformity of the various layers of fabrication becomes more critical as feature sizes are reduced, some now falling below 20 nm. Small variations in layer thickness have a larger impact on process variation and control. New process schemes are required to tolerate variations and maintain process control.

SUMMARY

Embodiments of the invention include a method of fabricating a semiconductor device. The invention comprises depositing a first layer on a substrate. Next, depositing a hard mask layer over at least a portion of the first layer, the hard mask layer including a lower hard mask layer over the first layer, a hard mask stop layer over the lower hard mask layer, and an upper hard mask layer over the hard mask stop layer. The hard mask layer and the first layer are patterned and a spacer is deposited on a sidewall of the patterned first layer and hard mask layer. The upper hard mask layer and a top portion of the spacer are removed by selectively etching the upper hard mask layer and the spacer with respect to the hard mask stop layer until reaching the hard mask stop layer. The upper hard mask layer possessing sufficient thickness such that when the hard mask stop layer is reached, the remaining spacer material extends at least to a first predetermined position on the sidewall. The hard mask stop layer is removed by selectively etching the hard mask stop layer with respect to the lower hard mask layer and spacer until reaching the lower hard mask layer. The first hard mask layer and a top portion of the spacer are removed by selectively etching the lower hard mask layer and the spacer with respect to the first layer until reaching the first layer. The lower hard mask layer possessing sufficient thickness such that when the first layer is reached, the remaining spacer material extends at least to a second predetermined position on the sidewall.

BRIEF DESCRIPTION OF THE SEVERAL VIEWS OF THE DRAWINGS

FIG. 1 depicts a perspective view of an example finFET transistor.

FIG. 2 is a cross sectional view of a semiconductor substrate upon which a finFET structure may be fabricated, in accordance with embodiments of the invention.

FIG. 3 illustrates a finFET fabricated from the semiconductor layer on the buried oxide layer of FIG. 2, in accordance with an embodiment of the invention.

FIG. 4 depicts the deposition of a gate layer of the finFET and buried oxide layer of FIG. 3, in accordance with an embodiment of the invention.

FIG. 5 illustrates the deposition of a hard mask on the gate layer of FIG. 4, in accordance with an embodiment of the invention.

FIG. 6 depicts the formation of a gate from the gate layer and hard mask of FIG. 5, according to a preferred embodiment of the invention.

FIG. 9 depicts the deposition of additional dielectric layers over the finFET of FIG. 8, in accordance with an embodiment of the invention.

FIGS. 10, 11 and 12 illustrate the removal of a portion of the hard mask to expose the gate of FIG. 6, in accordance with an embodiment of the invention.

DETAILED DESCRIPTION

Figure 7:
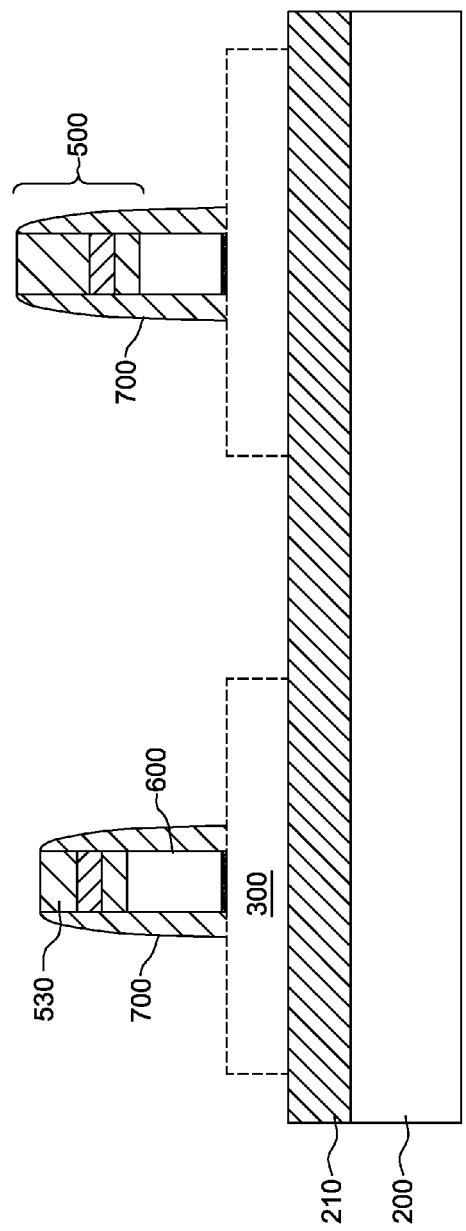
FIG. 7 illustrates the formation of a dielectric spacer on the sidewall of the gate and hard mask of FIG. 6, in accordance with an embodiment of the invention.

Embodiments of the present invention generally provide a process variability tolerant hard mask design for a RMG finFET device. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Referring now to the figures, FIG. 1 depicts a perspective view of an example finFET transistor 100. FinFET transistor 100 includes source 110, drain 112, fin 120, and gate 130. Fin 120 is the channel that connects source 110 and drain 112. Fin 120 typically has a height of about 5 nm to about 40 nm and a width of about 2 nm to about 40 nm. Gate 130 wraps a portion of fin 120 and is separated from fin 120 by gate oxide 140. The following FIGS. 2-14 depict cross-sectional views along line A-A' of FIG. 1.

FIG. 2 is a cross sectional view of a semiconductor substrate 200 upon which a finFET structure may be fabricated, in accordance with embodiments of the invention. Semiconductor substrate 200 is a semiconductor material, preferably a silicon-containing material including, but not limited to, silicon, silicon germanium alloys, silicon carbon alloys, or silicon germanium carbon alloys. In a preferred embodiment, the finFET structure is built on a silicon-on-insulator (SOI) substrate in which semiconductor substrate 200 includes buried oxide layer 210 and semiconductor layer 220. It should be appreciated by one skilled in the art that the invention is not limited to SOI construction, and that other semiconductor substrates may be used, for example, silicon-containing materials including, but not limited to, silicon, silicon germanium alloys, silicon carbon alloys, or silicon germanium carbon alloys.

FIG. 3 illustrates a finFET 300 fabricated from semiconductor layer 220 on buried oxide layer 210. FinFET 300 includes source 302, drain 304 and fin 306. Standard photolithographic and etching processes may be used to define the structure of finFET 300. In a preferred embodiment, nFET region 310 and pFET region 320 represent the symmetrical pair of p-type and n-type metal oxide semiconductor field effect transistors (MOSFETs) used in complementary metal-oxide-semiconductor (CMOS) technology.

FIG. 4 depicts the deposition of gate layer 400 according to an illustrative embodiment. Gate layer 400 composed of, for example, polysilicon, is deposited over finFET 300, and over buried oxide layer 210. A process such as CVD may be used. In a preferred embodiment, an insulating layer (not shown), for example of silicon oxide, is deposited over finFET 300 prior to the deposition of gate layer 400. The insulating layer may be formed by thermally oxidizing the exposed surface of finFET 300, or may be deposited onto finFET 300 using, for example, chemical vapor deposition (CVD) or atomic layer deposition (ALD). This insulating layer protects finFET 300 during the subsequent gate formation as described in more detail below. In other embodiments, the insulating layer is used as a gate oxide, such as gate oxide 140 illustrated in FIG. 1.

The topography of finFET 300 on buried oxide layer 210 may cause the deposited gate layer 400 to have height variations, with respect to buried oxide layer 210, that adversely affect subsequent processes. For example, the non-uniform surface of the deposited gate layer 400 may affect the depth of focus and uniformity of subsequent photolithographic and etching processes. Chemical-mechanical planarization (CMP) may be used to reduce the height variations in the topography of deposited gate layer 400, however, variations may still be present, as illustrated in FIG. 4. CMP may use a combination of chemical etching and mechanical polishing to smooth the surface and even out any irregular topography. In a preferred embodiment, gate layer 400 is composed of about 60 nm to about 150 nm, and preferably about 100 nm of polysilicon, above buried oxide layer 210 after the CMP process.

FIG. 5 illustrates the deposition of hard mask 500 on gate layer 400. Hard mask 500 is used to define the gate during the gate etch process, described below, and can also protect the gate during subsequent processing steps. For illustrative purposes, the thickness variations that may be present in gate layer 400 and hard mask 500 have been exaggerated. In a preferred embodiment, hard mask 500 includes three layers: first hard mask layer 510, deposited on gate layer 400; second hard mask layer 520, deposited on first hard mask layer 510; and third hard mask layer 530, deposited on second hard mask layer 520. In a preferred embodiment, first hard mask layer (or lower hard mask layer) 510, deposited on gate layer 400, is silicon nitride (SiN), deposited using, for example, low pressure chemical vapor deposition (LPCVD). Other first hard mask layer 510 materials may include, but are not limited to, hafnium oxide ($HfO_2$) or tantalum nitride (TaN). First hard mask layer 510 on gate layer 400 is a layer of sufficient thickness to protect gate layer 400 from damage during the removal of subsequent layers. It is also desirable to keep first hard mask layer 510 sufficiently thin thereby reducing thickness variability and reducing the etch time required for subsequent removal, as will be discussed below. In a preferred embodiment, first hard mask layer 510 is about 10 nm to about 50 nm thick and is preferably about 30 nm thick and is conformal to the top surface of gate layer 400.

Second hard mask layer 520 is deposited on first hard mask layer 510. Second hard mask layer (or hard mask stop layer) 520 is a material that has a substantially lower etch rate than third hard mask layer 530 thereby protecting first hard mask layer 510 during the patterning steps, described in more detail below, that include etching away third hard mask layer 530. In a preferred embodiment, second hard layer 520 is silicon oxide ($SiO_2$), deposited using, for example, CVD, plasma enhanced CVD (PECVD) or ALD. Second hard mask layer 520 is of sufficient thickness to protect first hard mask layer 510 and gate layer 400 from damage during the removal of third hard mask layer 530. In a preferred embodiment, second hard mask layer 520 is about 10 nm to about 50 nm thick and is preferably about 30 nm thick and is conformal to the top surface of first hard mask layer 510.

Third hard mask layer 530 is deposited on second hard mask layer 520. In a preferred embodiment, third hard mask layer (or upper hard mask layer) 530 is the same material as first hard mask layer 510, preferably SiN, deposited using, for example, LPCVD. Other third hard mask layer 530 materials may include, but are not limited to, hafnium oxide ($HfO_2$) or tantalum nitride (TaN). Third hard mask layer 530 is of a sufficient thickness to protect second hard mask layer 520, first hard mask layer 510, and gate layer 400 during the gate etch process and during the subsequent processing steps described in detail below with respect to FIGS. 7-10. In a preferred embodiment, third hard mask layer 530 is about 10 nm to about 80 nm thick and is preferably about 40 nm thick. A person of ordinary skill in the art will recognize that CMP steps may be inserted after the dielectric deposition processes to further planarize the surface. It should also be recognized that thickness variability caused by the CMP process will occur only in third hard mask layer 530, and not in first hard mask layer 510 or second hard mask layer 520.

FIG. 6 depicts the formation of gate 600 according to a preferred embodiment of the invention. Gate 600 is created by etching gate layer 400 using the gate pattern in hard mask 500 as an etch mask, using, for example, wet chemical etching or dry etching. In an exemplary embodiment, standard photolithographic processes are used to define the pattern of gate 600 in a layer of photoresist (not shown) deposited on third hard mask layer 530. The gate pattern may then be formed in hard mask 500 by removing hard mask 500 from the areas not protected by the pattern in the photoresist layer. First, third hard mask layer 530 is removed using, for example, reactive ion etching (RIE). RIE uses chemically reactive plasma, generated by an electromagnetic field, to remove various materials. A person of ordinary skill in the art will recognize that the type of plasma used will depend on the material of which third hard mask layer 530 is composed, or that other etch processes, e.g., wet chemical etch, laser ablation, etc., may be used. Next, second hard mask layer 520 is etched using the pattern in the photoresist and/or the patterned portion of third hard mask layer 530 as an etch mask, using for example RIE. A person of ordinary skill in the art will recognize that the type of plasma used may change based on the material of which second hard layer 520 is composed. Finally, first hard mask layer 510 is etched using, for example, RIE and using the pattern in the photoresist and/or the patterned portion of third hard mask layer 530 and second hard mask layer 520 as an etch mask. The result is the gate pattern formed in hard mask 500 which may be used as the etch mask to form gate 600. In an exemplary embodiment, a wet etch such as tetramethylammonium hydroxide (TMAH) or a dry etch such as RIE is used to etch gate layer 400 to form gate 600.

FIG. 7 illustrates the formation of dielectric spacer 700 according to an illustrative embodiment. For example, forming dielectric spacer 700 may include depositing a conformal layer (not shown) of insulating material, such as silicon nitride, over finFET 300, gate 600 and hard mask 500, such that the thickness of the deposited layer on the sidewall of finFET 300, gate 600 and hard mask 500 is substantially the same as the thickness of the deposited layer on the surface of buried oxide layer 210. An anisotropic etch process, wherein the etch rate in the downward direction is greater than the etch rate in the lateral directions, may be used to remove the insulating layer, thereby forming dielectric spacer 700. The etch process can be controlled such that the insulating layer may be removed from the sidewall surface of source 302 and drain 304 while forming dielectric spacer 700. The anisotropic etch process may also remove a portion of the top surface of third hard mask layer 530, introducing additional variability to the thickness of third hard mask 530.

Figure 8:
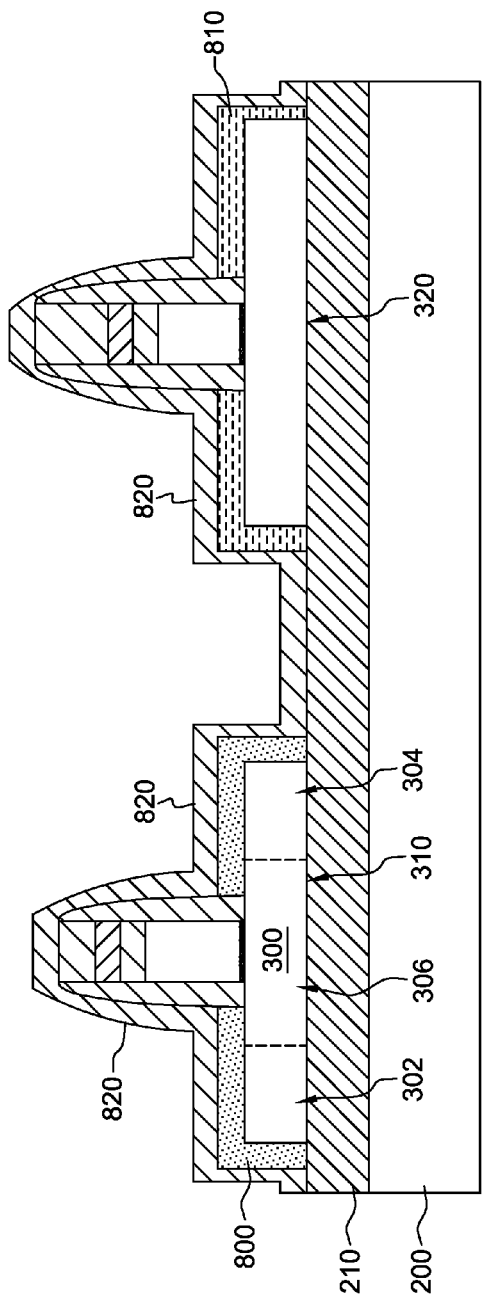
FIG. 8 illustrates the selective epitaxial growth of doped semiconductor material over the exposed source and drain of the finFET of FIG. 7, in accordance with an embodiment of the invention.

FIG. 8 illustrates the selective epitaxial growth of doped semiconductor material over source 302 and drain 304. In a preferred embodiment, n-type epitaxial silicon 800 and p-type epitaxial silicon 810 may be grown from exposed portions of finFET 300. A doped epitaxial layer may be grown on the surface of source 302, drain 304, and a portion of fin 306 using, for example, selective epitaxy, wherein the epitaxial layer grows only from the exposed portion of finFET 300 and does not grow from buried oxide layer 210. The type of dopant is selected based on the type of MOSFET. For example, an nFET type of transistor, such as the MOSFET of nFET region 310 is doped with an n-type material such as phosphorous. A suitable masking process may be used to protect, for example, pFET region 320 during the selective epitaxy of nFET region 310. In a preferred embodiment, n-type epitaxial silicon 800 is grown selectively using, for example, chemical vapor deposition (CVD). Similarly, a pFET type of transistor, such as the MOSFET of pFET region 320 is doped with a p-type material such as boron. A suitable masking process, such as SiN layer patterning, may be used to protect, for example, nFET region 310 during the selective epitaxy of pFET region 320. P-type epitaxial silicon 810 is grown from the expose portion of finFET 300 of pFET region 320 by selective epitaxy using, for example, CVD. Insulating layer 820 is deposited over the surface including buried oxide layer 210, n-type epitaxial silicon 800, p-type epitaxial silicon 810, dielectric spacers 700, and the top portion of hard mask 500. In a preferred embodiment, insulating layer 820 is the same material as dielectric spacer 700.

FIG. 9 depicts the deposition of additional dielectric layers 900 and 910. In a preferred embodiment, flowable oxide layer (FOX) 900 and high density plasma oxide (HDP oxide) 910 are deposited over finFET 300 to protect and further insulate the finFET and may provide a more planar surface for back-end-of-line (BEOL) processing. For example, flowable oxide layer (FOX) 900 is deposited using flowable chemical vapor deposition (FCVD) over insulating layer 820. FOX 900 fills the high aspect ratio spaces created by the fabrication of the semiconductor device, for example finFET 300, and creates a more planar surface for the deposition of high density plasma oxide (HDP oxide) 910. In a preferred embodiment, HDP oxide 910 is the top dielectric layer, deposited using, for example, plasma enhanced chemical vapor deposition (PECVD). The deposition of FOX 900 and HDP oxide 910 may be followed by a CMP process that will remove the top portion of HDP oxide 910 and planarize the top surface of HDP oxide 910. The CMP process may be selective to the material of HDP oxide 910, and not substantially remove the material of insulating layer 820, thereby exposing the portion of insulating layer 820 over third hard mask layer 530, using for example DA NanoMaterials® CMP. As discussed above, there may be variability in the thickness of third hard mask layer 530, affecting the removal process of third hard mask layer 530, as described in more detail below.

Figure 11:
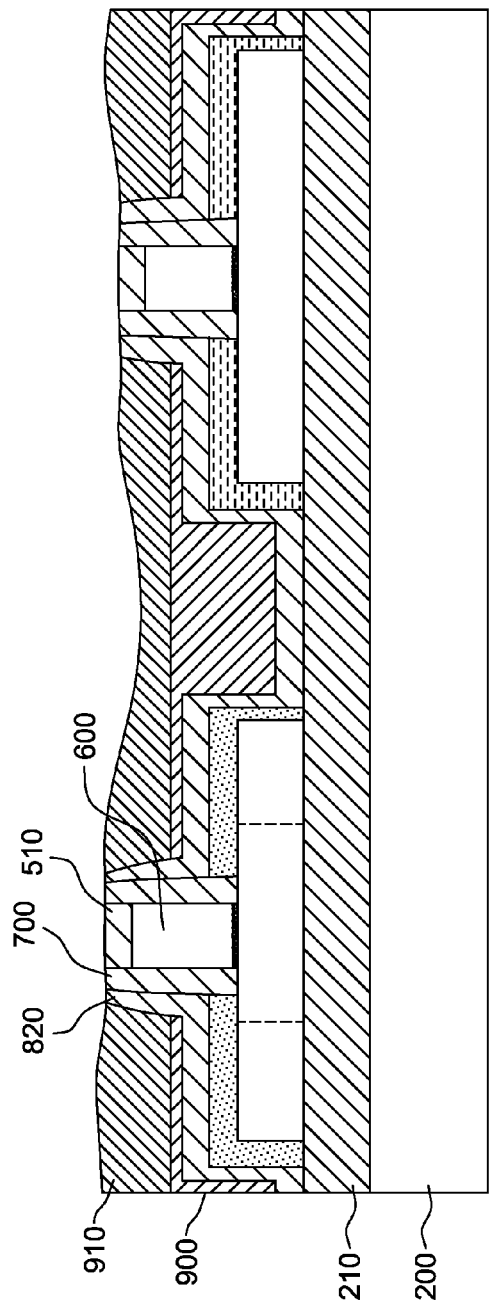
Figure 12:
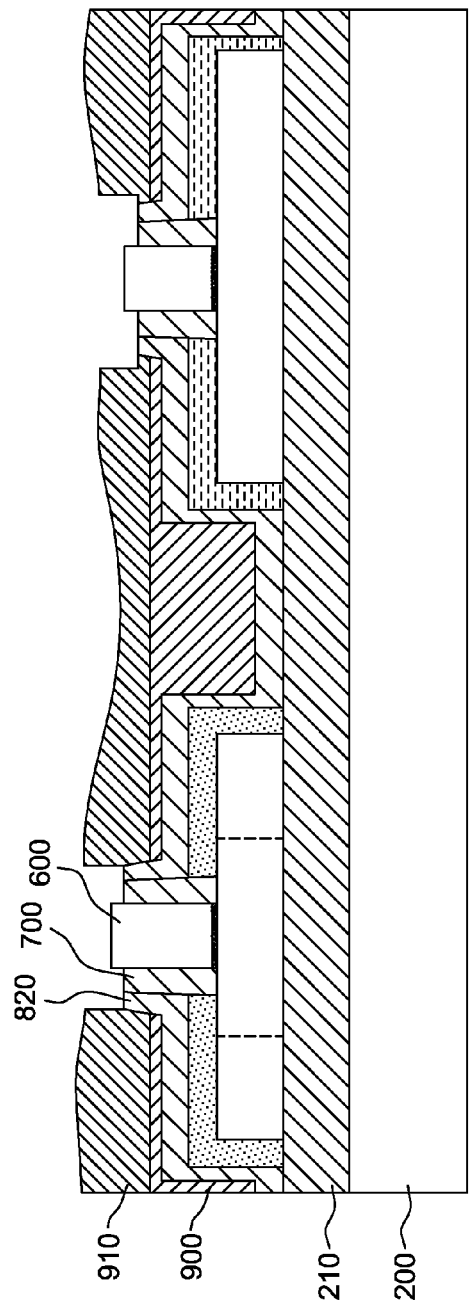

FIGS. 10, 11 and 12 illustrate the removal of a portion of hard mask 500 to expose gate 600. In an exemplary embodiment of a RMG process, gate 600 is exposed such that polysilicon gate 600 may be removed and replaced with a metal gate. Gate oxide 140 may be removed following the removal of gate 600 and replaced with a high-k dielectric material.

FIG. 10 shows the first step of the removal process of third hard mask layer 530. In a preferred embodiment, a first step removes the previously exposed portion of third hard mask layer 530, and also includes a portion of insulating layer 820 and a portion of dielectric spacer 700, creating gate opening 1000. As discussed above, variability in the thickness of third hard mask layer 530, of FIG. 9, affects the removal process of third hard mask layer 530 and the subsequent opening by comparing the depth of gate opening 1000A and 1000B. In a preferred embodiment, RIE is used to remove the top portion of hard mask 500 that includes third hard mask layer 530. The end point of the etch process is the complete removal of third hard mask layer 530, reaching second hard mask layer 520, and the removal of a predetermined portion of dielectric spacer 700. The end point of the RIE process may be detected by monitoring the plasma emissions during the etch process. The measured emission shows the material of third hard mask layer 530, for example, SiN. After the removal of third hard mask layer 530 is complete, second hard mask layer 520 is exposed, thereby significantly reducing the measured emission of the material of third hard mask layer 530. Observance of the measured reduction of the emission of the material of third hard mask layer 530 indicates that the end point has been achieved. Additionally, second hard mask layer 520 may prevent further attack of hard mask 500 because the etch rate of second hard mask layer 520 in the RIE process used to remove hard mask layer 530 is significantly slower than the etch rate of third hard mask layer 530. Alternatively, phosphoric acid at an elevated temperature can be used to achieve highly selective removal of a SiN layer with respect to a $SiO_2$ layer.

FIG. 11 depicts the removal of second hard mask layer 520. Second hard mask layer 520 may be removed from the surface of first hard mask layer 510 along with a portion of high density plasma oxide 910 using, for example, DA NanoMaterial® CMP, to reach first hard mask layer 510. Removal of second hard mask layer 520 exposes first hard mask layer 510, dielectric spacer 700, and insulating layer 820. As described above, first hard mask layer 510 is a conformal layer deposited over gate layer 400 of FIG. 5, gate layer 400 being used to fabricate gate 600. According to a preferred embodiment, first hard mask layer 510 was protected from thickness variations caused by degradation during subsequent processing steps, by second hard mask layer 520 and third hard mask layer 530. FIG. 12 illustrates the removal of first hard mask layer 510. In a preferred embodiment, first hard mask layer 510 is removed using, for example, RIE, exposing the top surface of gate 600. The RIE process may be more easily controlled because first hard mask layer 510 is thin and uniform, thereby reducing over etching of dielectric spacer 700, and insulating layer 820 to a predetermined position on the sidewall of gate 600. As a result, the difference between the top surface of dielectric spacer 700 and the top of gate 600 can be controlled from about 5 nm to about 30 nm or preferably from about 10 nm to about 20 nm.

Figure 13:
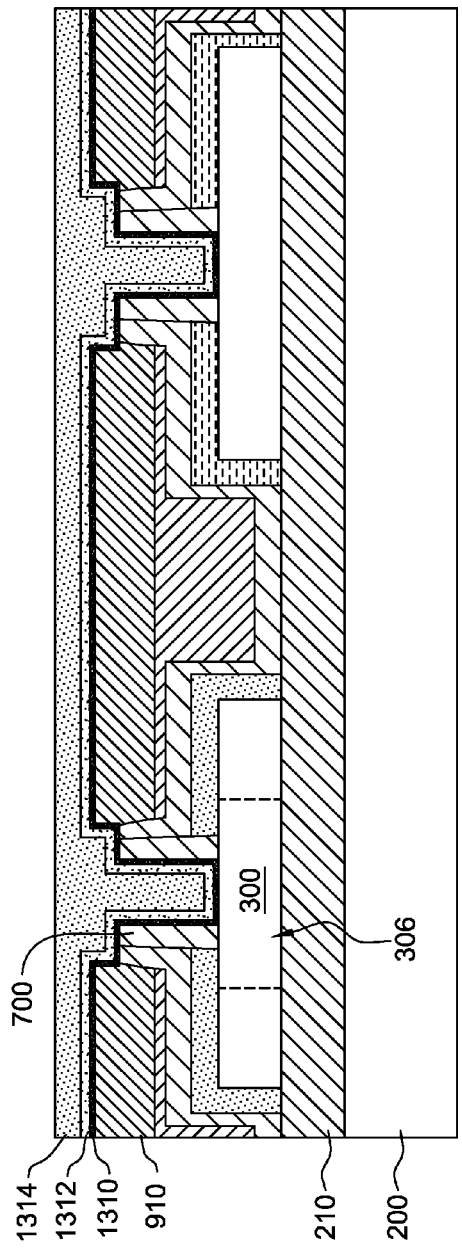
FIGS. 13 and 14 illustrate the RMG process according to an exemplary embodiment of the invention.
Figure 14:
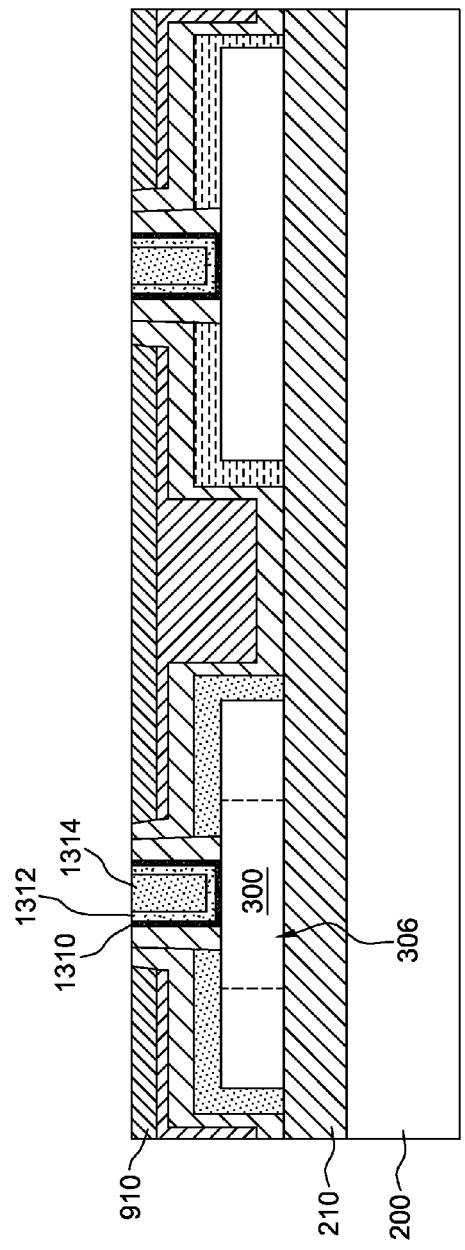

FIGS. 13 and 14 illustrate the RMG process according to an exemplary embodiment of the invention. Gate 600 of FIG. 12, sometimes referred to as a dummy gate in a RMG process, may be removed using a wet chemical etch, such as TMAH, or a dry etch such as RIE, leaving a gate trench wherein the gate trench sidewalls are dielectric spacer 700, and the trench base is buried oxide layer 200 and exposed portions of fin 306 of finFET 300. A stack of materials for the RMG, known to someone skilled in the art, is deposited using for example, CVD or ALD and may include a high-k dielectric material. In an exemplary embodiment, the RMG process starts with the deposition of high-k gate oxide layer 1310 of a high-k dielectric material such as hafnium dioxide. High-k gate oxide layer 1310 is deposited on the surface of HDP oxide 910, the exposed top and sidewall surface of dielectric spacer 700, the exposed portion of buried oxide layer 200, and the exposed portion of fin 306. In one exemplary embodiment, the replacement metal gate includes workfunction setting metal 1312 and fill metal 1314. Workfunction setting metal 1312 may be a material such as titanium nitride (TiN) or tantalum nitride (TaN) deposited over high-k gate oxide layer 1310. Fill metal 1314 is deposited over workfunction setting metal 1312, filling the gate trench with, for example, tungsten (W) or aluminum (Al). The various layers and materials depicting the RMG process are presented as examples and are not meant to be limiting.

FIG. 14 depicts the removal of excess replacement gate materials from the surface of HDP oxide 910. For example, CMP may be used to remove the excess replacement gate materials that include gate oxide layer 1310, workfunction setting metal 1312, and fill metal 1314 that are not in the gate trench, from the surface of HDP oxide 910. The result is a replacement gate that partially surrounds a portion of fin 306 of finFET 300.

The resulting semiconductor device may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a process variability tolerant hard mask design for a RMG finFET device (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed:
1. A method of fabricating a semiconductor device, the method comprising:
depositing a first layer on a substrate;
depositing a hard mask layer over at least a portion of the first layer, the hard mask layer including a lower hard mask layer over the first layer, a hard mask stop layer over the lower hard mask layer, and an upper hard mask layer over the hard mask stop layer;

patterning the hard mask layer and the first layer;

depositing a spacer on a sidewall of the patterned first layer and hard mask layer;

removing the upper hard mask layer and a top portion of the spacer by selectively etching the upper hard mask layer and the spacer with respect to the hard mask stop layer until reaching the hard mask stop layer, the upper hard mask layer possessing sufficient thickness such that when the hard mask stop layer is reached, the remaining spacer material extends at least to a first predetermined position on the sidewall;

removing the hard mask stop layer by selectively etching the hard mask stop layer with respect to the lower hard mask layer and spacer until reaching the lower hard mask layer; and removing the lower hard mask layer and a top portion of the spacer by selectively etching the lower hard mask layer and the spacer with respect to the first layer until reaching the first layer, the lower hard mask layer possessing sufficient thickness such that when the first layer is reached, the remaining spacer material extends to at least a second predetermined position on the sidewall.

2. The method of claim 1, wherein the semiconductor device is a finFET.

3. The method of claim 1, wherein the first layer forms a dummy gate of a RMG process.

4. The method of claim 3, further comprising the steps of:
removing the dummy gate;
depositing at least a replacement gate metal; and
removing the excess replacement gate metal not in the gate trench.

5. The method of claim 4, further comprising the deposition of a high-k dielectric subsequent to removing the dummy gate, prior to depositing the replacement gate metal.

6. The method of claim 1, wherein the emissions of the etch process to remove the upper hard mask layer are monitored to detect reaching the hard mask stop layer.

7. The method of claim 1, wherein the lower hard mask layer is SiN from about 10 nm to about 30 nm thick.

8. The method of claim 1, wherein the hard mask stop layer is $SiO_2$ from about 10 nm to about 30 nm thick.

9. The method of claim 1, wherein the upper hard mask layer is SiN from about 10 nm to about 80 nm thick.

10. The method of claim 1, wherein the hard mask stop layer removal process is a CMP selective to the material of the hard mask stop layer and does not substantially attack the lower hard mask layer.

* * * * *